United States Patent
Gama et al.

(10) Patent No.: US 7,076,667 B1
(45) Date of Patent: Jul. 11, 2006

(54) STORAGE DEVICE HAVING SECURE TEST PROCESS

(75) Inventors: Shinkichi Gama, Yokohama (JP); Shogo Shibazaki, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/531,105

(22) Filed: Mar. 17, 2000

(30) Foreign Application Priority Data

Jul. 9, 1999 (JP) .................................. 11-195527

(51) Int. Cl.
*G06F 12/14* (2006.01)

(52) U.S. Cl. ...................... 713/193; 713/166; 713/182; 713/184; 714/718; 714/719; 710/1; 710/267; 711/163; 711/164

(58) Field of Classification Search ................ 713/193, 713/166, 182, 184; 714/718, 719; 710/1, 710/267; 711/163, 164

See application file for complete search history.

(56) References Cited

U.S. PATENT DOCUMENTS

| | | | | |
|---|---|---|---|---|
| 4,521,852 A | * | 6/1985 | Guttag | 711/163 |
| 5,293,610 A | * | 3/1994 | Schwarz | 711/164 |
| 5,394,367 A | * | 2/1995 | Downs et al. | 365/195 |
| 5,406,519 A | * | 4/1995 | Ha | 365/195 |
| 5,465,341 A | * | 11/1995 | Doi et al. | 714/30 |
| 6,457,126 B1 | * | 9/2002 | Nakamura et al. | 713/166 |

* cited by examiner

*Primary Examiner*—Ayaz Sheikh
*Assistant Examiner*—Taghi T. Arani
(74) *Attorney, Agent, or Firm*—Staas & Halsey LLP

(57) ABSTRACT

In a storage device for maintaining information when power is OFF and being capable of executing a test process based on test signals, a test terminal inputs the test signals and an instruction part sends a read out instruction for instructing a memory storing secret data to read out data. Moreover, a decoding part decodes whether or not the data read out by the memory in response to the data reading instruction is the secret data stored in the memory and a maintaining part maintains information in a volatile state resulting from the decoding part. Furthermore, a cutting-off part cuts off the test signals input from the test terminal when the maintaining part maintains information indicating that the secret data is stored.

10 Claims, 10 Drawing Sheets

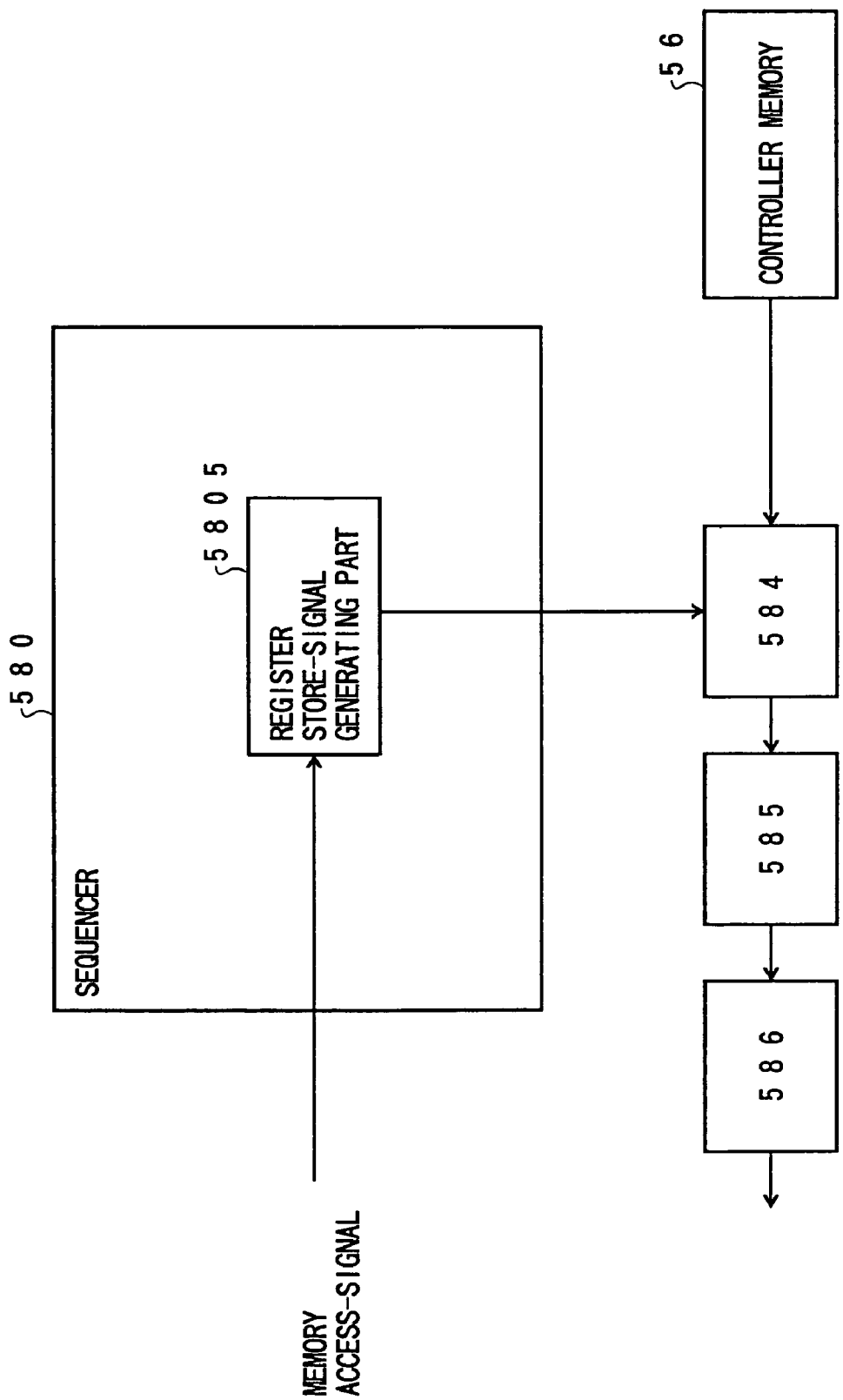

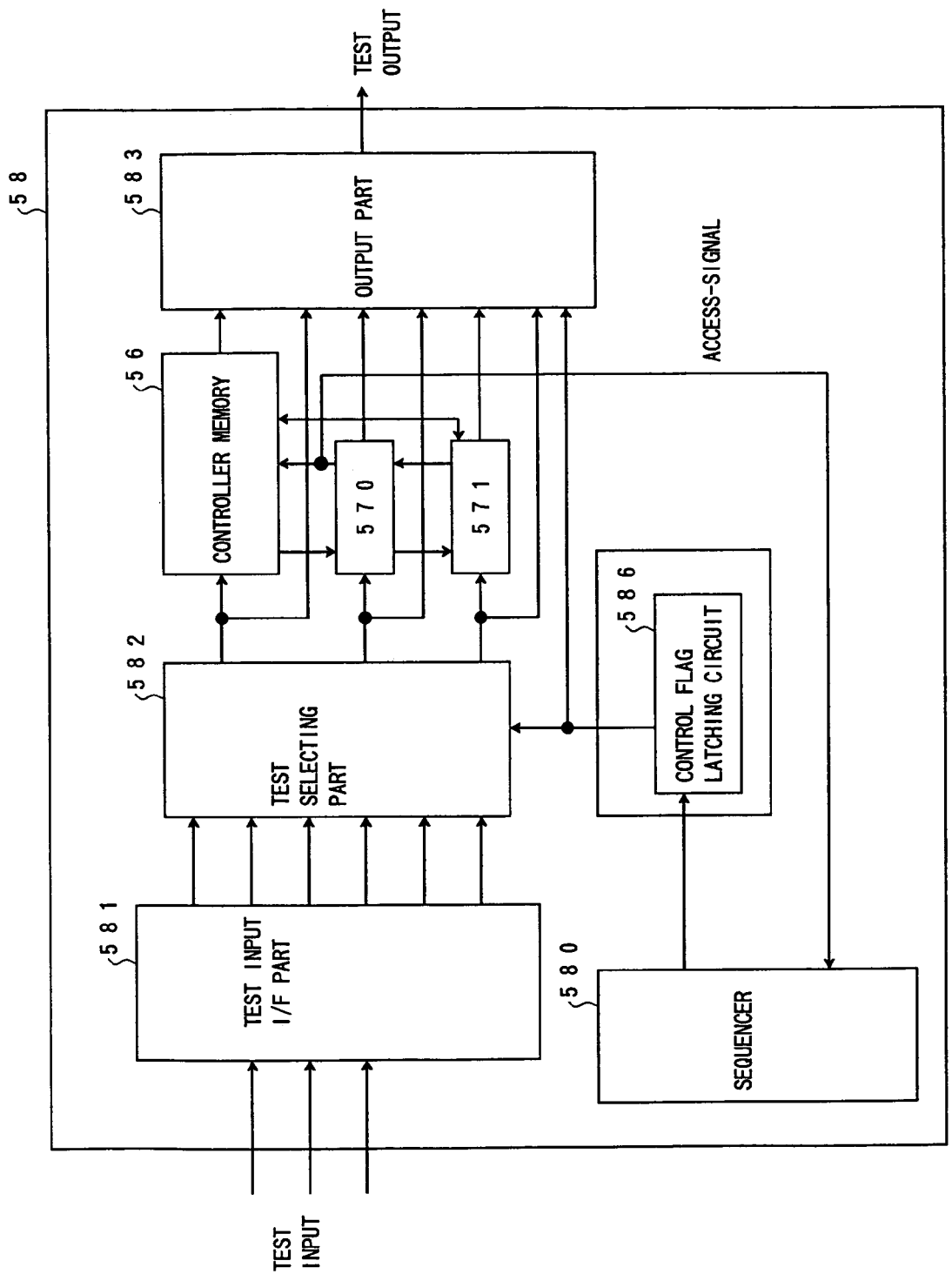

STORAGE DEVICE HAVING SECURE TEST PROCESS

BACKGROUND OF THE INVENTION

1. Field of the Invention

The present invention generally relates to storage devices including non-volatile memory that maintain data after a power source is shut off, and more particularly to a storage device that can execute a test process based on a test signal output from a test terminal while maintaining high security.

It is important to maintain high security for data stored in the storage device. It is also important to improve the quality of the storage device.

To improve the quality of the storage device, it is required to test for failures in storage devices after assembly is completed. Generally, it is needed to provide a test terminal to test the storage device. However, the provided test terminal makes it possible for outsiders to easily obtain data such as a cipher key or secret data stored in the storage device.

Consequently, it is desired to not only realize higher security but also develop a technology to test fully assembled storage devices.

2. Description of the Related Art

For example, a non-volatile storage device such as a memory stick is used to record an encrypted copyrighted product such as music.

In a case in which the test terminal is provided for the storage device, when the cipher key is read by an illegal user, the copyrighted product may be easily pirated.

Further, an authentication is processed based on cipher text by using a shared cipher key between the non-volatile memory and a host device for use thereof.

Disadvantageously, in this case, when the cipher key is read, a host device used by the illegal user can obtain data from the non-volatile memory by utilizing the test terminal.

Accordingly, the test terminal is not conventionally provided for the non-volatile memory so as to prevent a cipher key or secret data from being stolen by utilizing the test terminal and the test function.

In the above conventional non-volatile memory, illegal users' infringement can be prevented and high security can be maintained.

However, makers manufacturing conventional non-volatile memories can not properly test fully assembled non-volatile memory to ensure the quality thereof.

In the conventional manner, it is difficult to improve the quality of the non-volatile memory.

SUMMARY OF THE INVENTION

It is a general object of the present invention to provide a storage device maintaining data when the power source is shut off, which can execute a test process based on test signals by using a test terminal while maintaining high security, in which the above-mentioned problems are eliminated.

A more specific object of the present invention is to provide a storage device maintaining data when the power source is shut off, which can execute a test process based on test signals by using a test terminal and also prevent information stored in the storage device from being illegally read by utilizing the test terminal.

The above first object of the present invention is achieved by a storage device for maintaining information when power is OFF and being capable of executing a test process based on test signals, including: a test terminal inputting the test signals; an instruction part sending a reading instruction for instructing a memory storing secret data to read out data; a decoding part decoding whether or not the data read out by the memory in response to the data reading instruction is the secret data stored in the memory; a maintaining part maintaining information in a volatile state resulting from the decoding part; and a cutting-off part cutting off the test signals input from the test terminal when the maintaining part maintains information indicating that the secret data is stored.

According to the present invention, based on the result by the decoding part, the test signals input from the test terminal is cut off. Therefore, it is possible to prevent information stored in the storage device from being read by illegal users utilizing the test terminal.

The above first object of the present invention is achieved by a storage device for maintaining information when power is OFF and being capable of executing a test process based on test signals, including: a decoding part gathering a set of data read out by a memory storing secret data in response to an access request and decoding based on the set of data whether or not the secret data is stored, a maintaining part maintaining information in a volatile state resulting from the decoding part; and a cutting-off part cutting off the test signals input from a test terminal when the maintaining part maintains information indicating that the secret data is stored.

According to the present invention, when the secret data is stored, the test process is prohibited by cutting off the test signals. Therefore, it is possible to prevent information stored in the storage device from being read by illegal users utilizing the test terminal.

The above first object of the present invention is achieved by a storage device for maintaining information when power is OFF and being capable of executing a test process based on test signals, including: a maintaining part maintaining, in a volatile state, information indicating that an access request is conducted to a memory storing secret data; and a cutting-off part cutting off the test signals input from a test terminal when the maintaining part maintains the information indicating that the access request is conducted to the memory storing secret data.

According to the present invention, when the access request is conducted to the memory, the test process is prohibited by cutting off the test signals. Therefore, it is possible to prevent information stored in the storage device from being read by illegal users utilizing the test terminal.

BRIEF DESCRIPTION OF THE DRAWINGS

Other objects, features and advantages of the present invention will become more apparent from the following detailed description when read in conjunction with the accompanying drawings, in which:

FIG. 8 is a diagram showing a configuration of a sequencer according to the third embodiment of the present invention;

FIG. 9 is a diagram showing a security part according to a fourth embodiment of the present invention.

DESCRIPTION OF THE PREFERRED EMBODIMENTS

Figure 1:
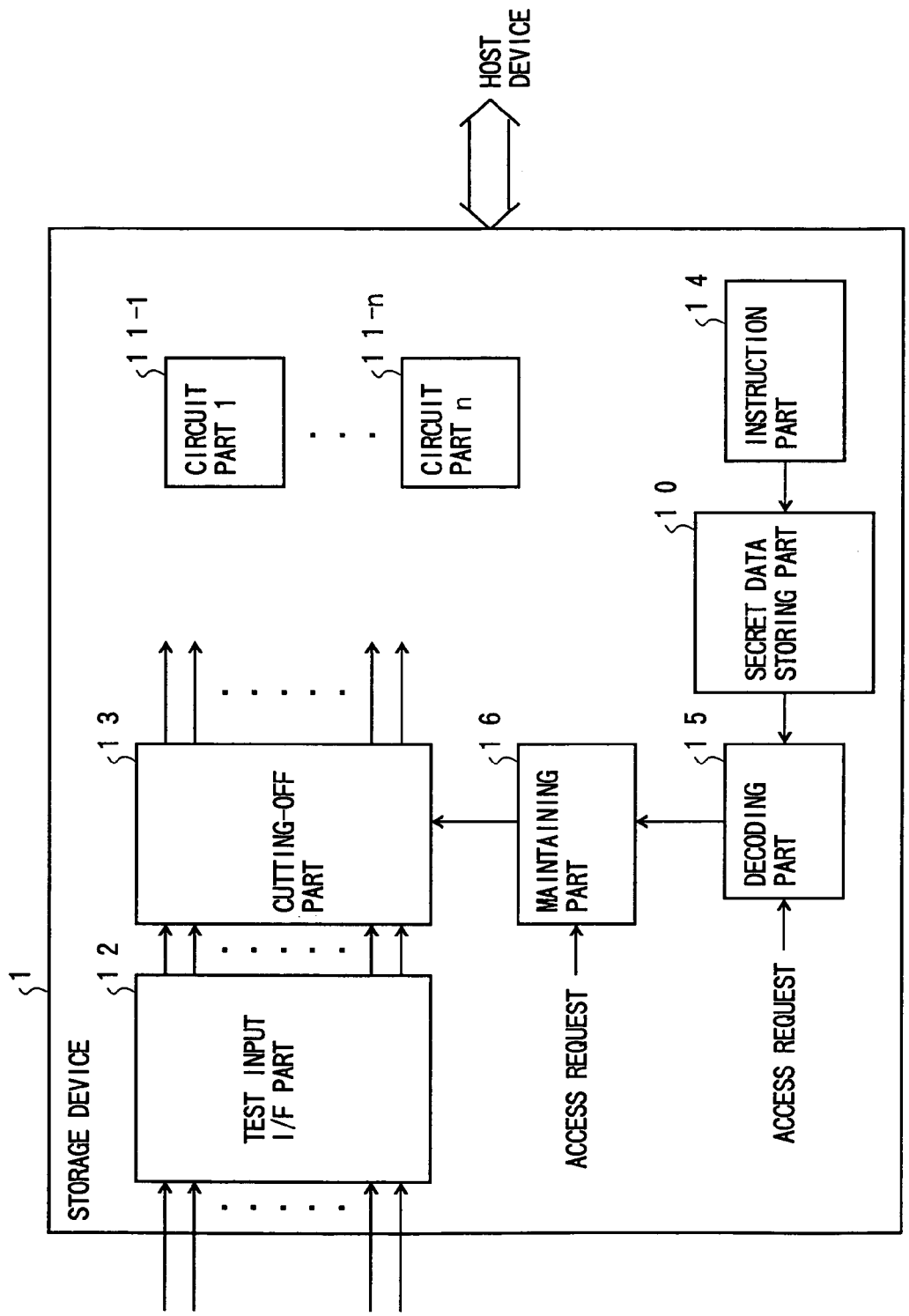
FIG. 1 is a diagram showing a principle configuration of a storage device according to a first embodiment of the present invention.

FIG. 1 is a diagram showing a principle configuration of a storage device according to a first embodiment of the present invention.

FIG. 1 shows a storage device 1 according to the present invention that can maintain data when the power source is shut off and execute a test process based on a test signal input from a test terminal.

The storage device 1 according to the present invention includes a secret data storing part 10, circuit parts 11-$i$ ($i$=1 through n), a test input I/F (interface) part 12, a cutting-off part 13, an instruction part 14, a decoding part 15 and a maintaining part 16.

The secret data storing part 10 stores secret data including cipher keys. When there is no secret data to be stored, data that is different from any secret data is stored as initial data. When secret data is stored and a data area other than the secret data area storing the secret data is provided, the secret data storing part 10 may store data indicating a presence of secret data in the other data area.

The circuit parts 11-$i$ ($i$=1 through n) read the secret data from the secret data storing part 10 and execute a predetermined process by using the secret data. The test input I/F part 12 sends test signals, which are received from a test terminal, to the circuit parts 11-$i$ via the cutting-off part 13. The cutting-off part 13 cuts off test signals from the test input I/F part 12.

The instruction part 14 sends a data reading instruction to the secret data storing part 10. The decoding part 15 determines by decoding data read from the secret data storeing part 10 whether or not the secret data is stored. The maintaining part 16 maintains in a volatile state a decryption result produced by the decoding part 15.

In the storage device 1 configured above, the instruction part 14 sends a data reading instruction to the secret data storing part 10 to read normal data when the power source is turned ON or when the storage device is reset or when a command for processing secret data is received.

At the same time, the instruction part 14 sends the secret data storing part 10 a data reading instruction to read the secret data, to read data other than working data, or to read data indicating the presence of the secret data stored in the data area other than the secret data area.

In response to the instruction from the instruction part 14, when the secret data is stored, the secret data storing part 10 outputs the secret data or an address of the secret data. When the secret data is not stored the secret data storing part 10 outputs the initial data different from the secret data or data indicating that the secret data is not stored. In response to the output data from the instruction part 14, the decoding part 15 decrypts the output data indicating whether or not the secret data is stored in the secret data storing part 10.

Further in response to the decryption result of the decoding part 15, the maintaining part 16 maintains information indicating whether or not the secret data is stored in the secret data storing part 10. Subsequently, when the maintaining part 16 maintains information indicating that the secret data is stored, the cutting-off part 13 cuts off a test signal input from the test input I/F part 12.

As mentioned above, in the storage device 1 according to the present invention, when the secret data storing part 10 stores the secret data, the test signals are cut off. Therefore, the storage device 1 can maintain high security substantially equivalent to that maintained by a conventional storage device not including a test terminal. In addition, it is possible to execute a test to improve the quality of the storage device according to the present invention.

On the other hand, in the storage device 1 according to the present invention, when an access request is done for the secret data storing part 10, the decoding part 15 obtains data that is read by the secret data storing part 10 responding to the access request and decrypts the obtained data whether or not the secret data is stored in the secret data storing part 10.

In response to the decryption result of the decoding part 15, the maintaining part 16 maintains information indicating whether or not the secret data is stored in the secret data storing part 10. Subsequently, the cutting-off part 13 cuts off the test signal input from the test input I/F part 12 when the maintaining part 16 maintains information indicating an address of the secret data.

But alternatively, when the access request is done for the secret data storing part 10, the maintaining part 16 may maintain information indicating that the access request is done. And, the cutting-off part 13 may immediately cut off the test signal input from the test terminal.

As mentioned above, in the storage device 1 according to the present invention, the access request for the secret data storing part 10 is detected. After that, the test signal is cut off. Therefore, the storage device 1 can maintain high security substantially equivalent to that maintained by the conventional storage device not including a test terminal. In addition, it is possible to execute a test to improve quality of the storage device according to the present invention.

Figure 2:
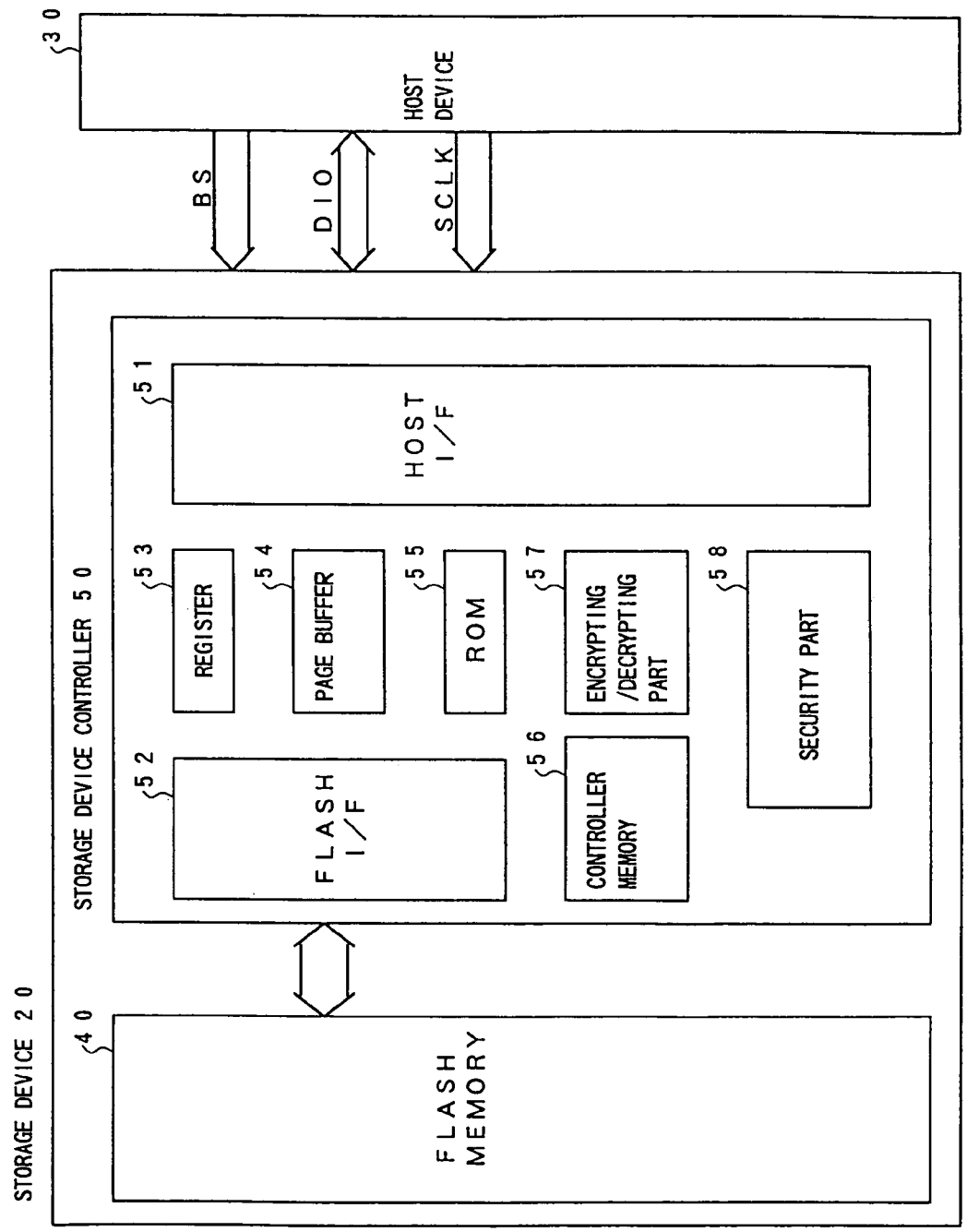
FIG. 2 is a diagram showing an application of the storage device according to the first embodiment of the present invention.

FIG. 2 is a diagram showing an application of the storage device according to the first embodiment of the present invention.

In FIG. 2, a storage device 20 embodies the present invention and a host device 30 uses the storage device 20.

The storage device 20 according to the present invention includes a flash memory 40 and a storage device controller 50. The host device 30 starts to communicate with the storage device 20 by sending a serial protocol bus state signal (BS) and a serial protocol clock signal (SCLK). After that, the host device 30 and the storage device 20 communicate with each other by sending or receiving a serial protocol data signal (DIO).

The storage device controller 50 includes a host I/F (interface) 51 for processing signals between the host device 30 and the storage device 20, a flash I/F (interface) 52 for processing signals between the storage device controller 50 and the flash memory 40, a register 53, a page buffer 54, ROM 55, a controller memory 56, an encrypting/decrypting part 57 and a security part 58.

Figure 3:
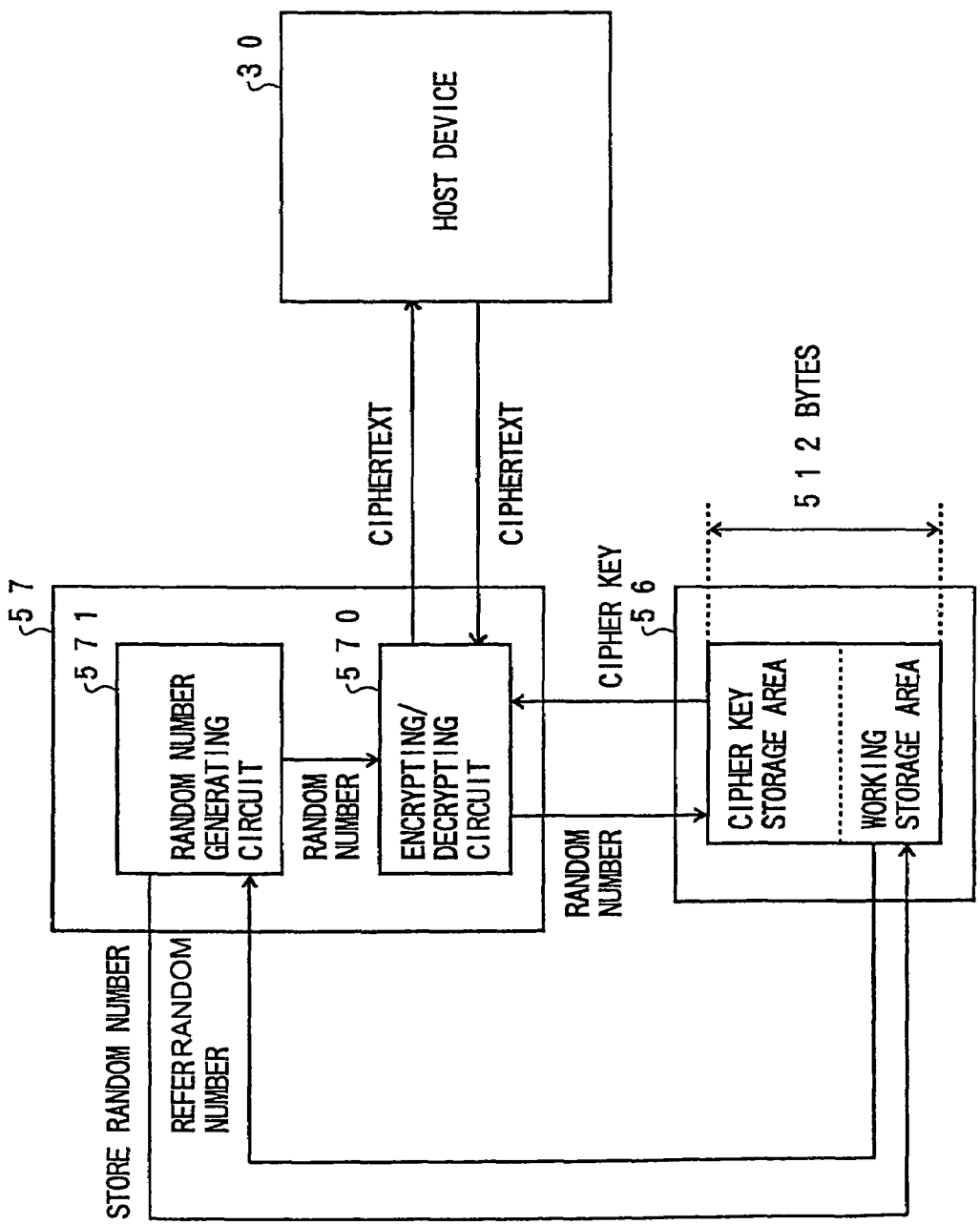
FIG. 3 is a schematic diagram showing an operation between a host device and a storage device controller according to the present invention.

FIG. 3 is a schematic block diagram showing an operation between the host device 30 and the storage device controller 50 according to the present invention.

As shown in FIG. 3, the encrypting/decrypting part 57 includes an encrypting/decrypting circuit 570 and a random number generating circuit 571. For example, the storage device controller memory 56 includes 512 bytes providing a cipher key storage area to store a plurality of cipher keys and a working storage area to store a random number generated by the random number generating circuit 571.

When the cipher keys are not stored, a predetermined initial data such as all zero data, which is not used for any cipher key, is stored in the cipher key storage area of the storage device controller memory 56.

In the encrypting/decrypting part 57, when the storage device controller 50 needs to communicate with the host device 30, the random number generating circuit 571 generates a random number and provides the random number to the encrypting/decrypting circuit 570. The encrypting/decrypting part 57 also stores the random number in the working storage area of the controller memory 56.

When the encrypting/decrypting circuit 570 receives the random number from the random number generating circuit 571, the encrypting/decrypting circuit 570 reads one cipher key indicated by the random number from the cipher key storage area of the controller memory 56 and encrypts the read cipher key by using the random number provided and then sends the encrypted cipher key as cipher text to the host device 30.

When receiving the cipher text from the storage device controller 50, the host device 30 obtains the cipher key as plain text the same as the encrypting/decrypting circuit 570 read, by decrypting the cipher text. The host device 30 encrypts data necessary to reply to the storage device controller 50, by using the cipher key so as to make cipher text.

When receiving the cipher text from the host device 30, the encrypting/decrypting circuit 570 decrypts the cipher text by using the same cipher key.

As mentioned above, the storage device controller 50 sends or receives cipher text to/from the host device 30 by a cipher key used as a shared key. However, in a case of an authentication, it is required to communicate by cipher text using a plurality of cipher keys to realize higher security. In this case, the random number generating circuit 571 retrieves a previous random number stored in the working storage area of the controller memory 56 and generates a next random number based on the previous random number so as to avoid generating the previous random number again. Thus, the random number generating circuit 571 can generate a number at random.

In order to ensure the quality of the storage device 20 having the storage device controller 50 capable of processing as mentioned above, it is required to test whether or not the storage device controller 50 performs as designed. However, if the storage device controller 50 can perform this function, it is possible for an illegal user to steal the cipher keys by utilizing the function.

Thus, in order to eliminate this disadvantage, the security part 58 is provided in the storage device controller 50 as shown in FIG. 2.

Figure 4:
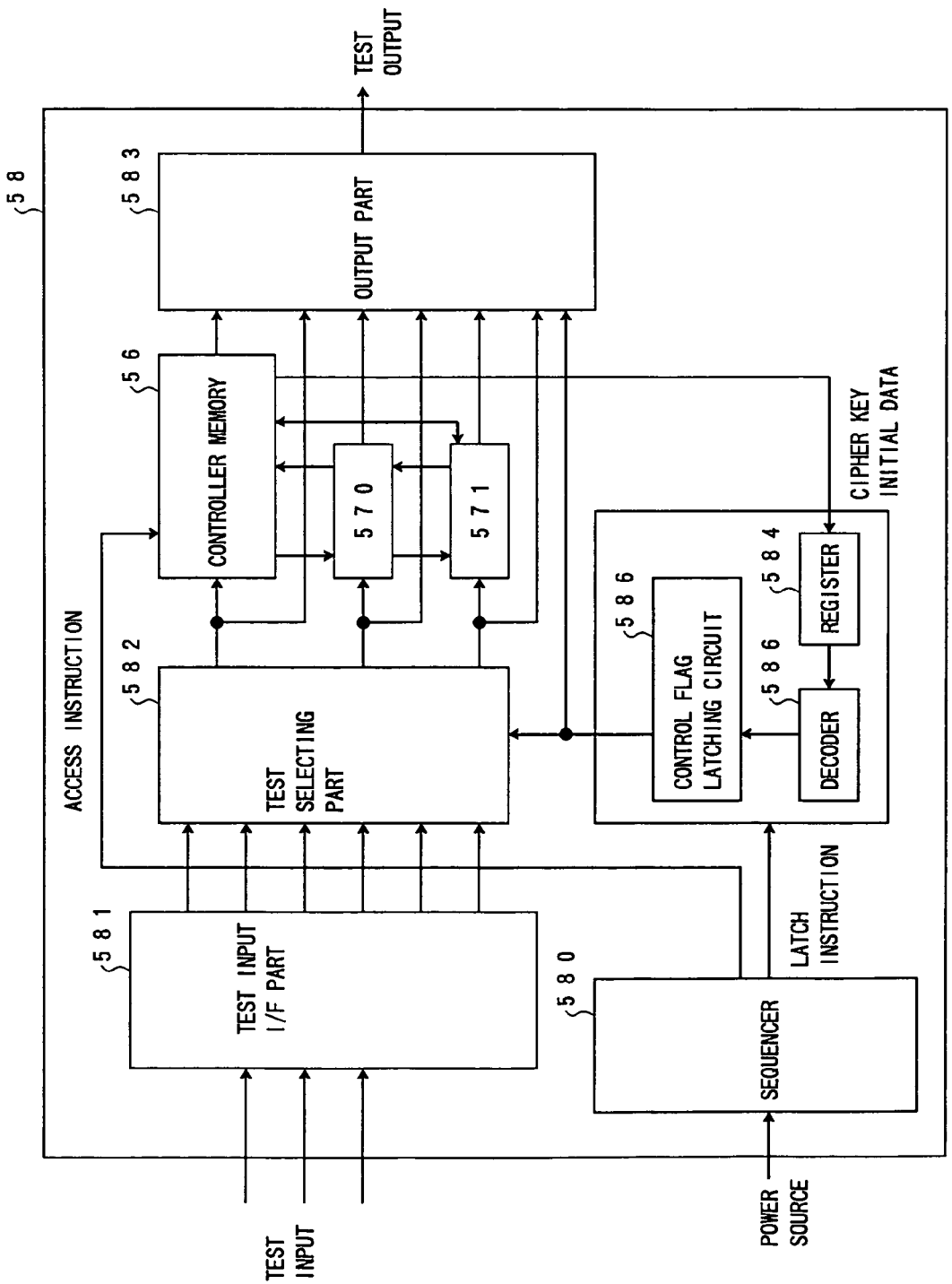
FIG. 4 is a diagram showing a security part according to the first embodiment of the present invention.

FIG. 4 is a diagram showing the security part 58 according to the first embodiment of the present invention. In FIG. 4, parts that are the same as those shown in FIG. 2 or FIG. 3 are given the same reference numbers.

In FIG. 4, the security part 58 includes a sequencer 580, a test input interface 581, a test selecting part 582, an output part 583, a register 584, a decoder 585 and a control flag latching circuit 586.

The sequencer 580 is executed by power ON and executes an entire process. The test input interface 581 conducts test signals input from the test terminal and decodes the test signals so as to execute a test function corresponding to the test signals.

The test selecting part 582 determines to cut off test signals output from the test input interface 581 based on a control flag latched by the control flag latching circuit 586. The output part 583 outputs the test signals to the test output terminal.

The register 584 maintains data retrieved from the controller memory 56. The data is the cipher key when the cipher key is stored or the initial data when the cipher key is not stored.

The decoder 585 determines whether or not the data stored in the register 584 is the cipher key, by decoding the data stored in the register 584. The control flag latching circuit 586 controls the test selecting part 582 by latching a result decoded from the decoder 585.

Figure 5:
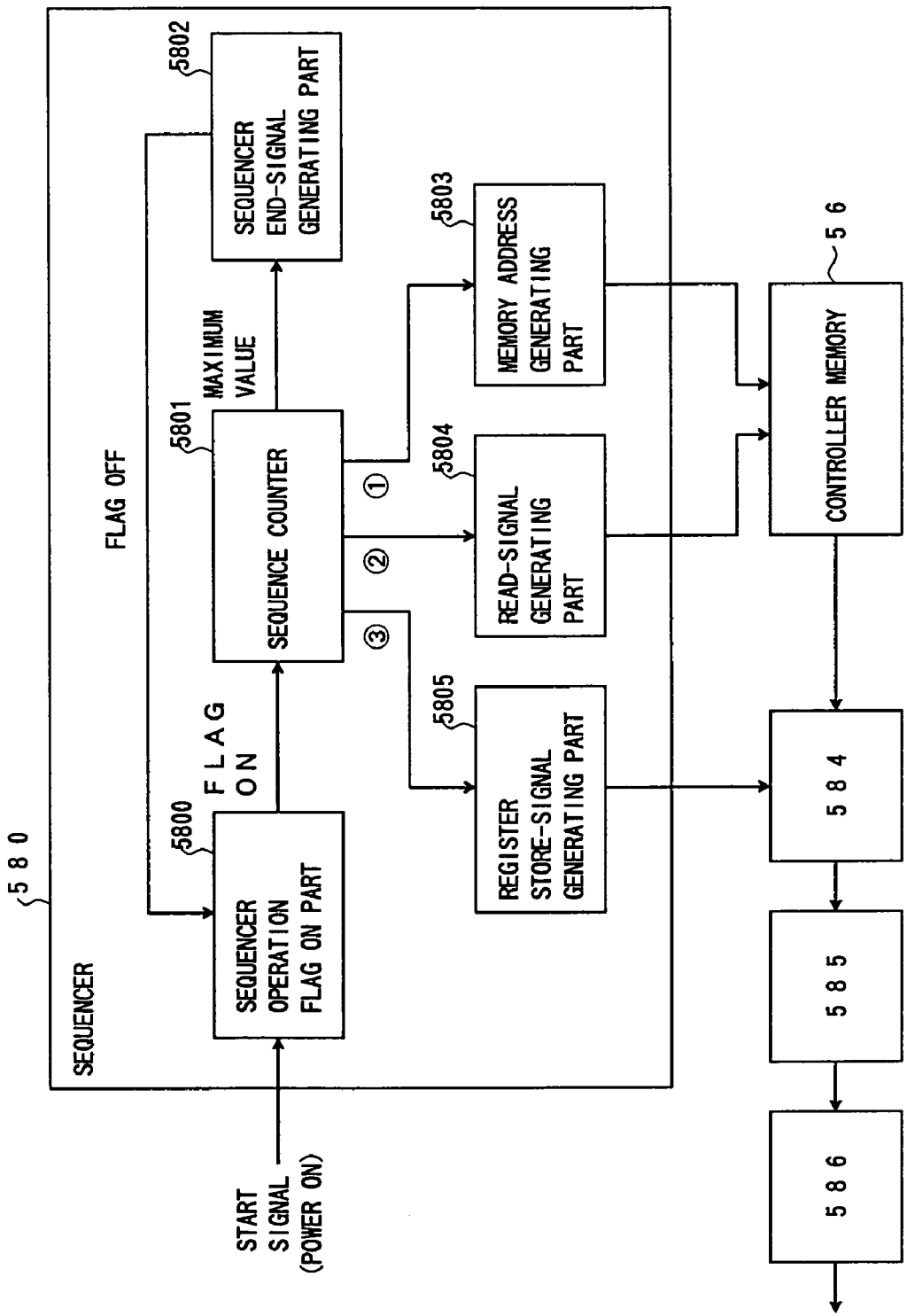
FIG. 5 is a diagram showing a sequencer of the security part according to the first embodiment of the present invention.

FIG. 5 is a diagram showing a sequencer of the security part according to the first embodiment of the present invention.

As shown in FIG. 5, the sequencer 580 includes a sequencer operation flag ON part 5800, a sequence counter 5801, a sequencer end-signal generating part 5802, a memory address generating part 5803, a read-signal generating part 5804 and a register store-signal generating part 5805.

The sequencer operation flag ON part 5800 turns ON an operation flag when power is turned ON. The sequence counter 5801 increments a counter while the operation flag is ON. When the counter reaches a predetermined value, the sequence counter 5801 executes the memory address generating part 5803, the read-signal generating part 5804 and the register store-signal generating part 5805. The sequencer end-signal generating part 5802 generates an end-signal to turn OFF the operation flag when the counter of the sequence counter 5801 reaches a maximum value.

The memory address generating part 5803 generates a memory address indicating the cipher key stored in the controller memory 56. The read-signal generating part 5804 generates a read-signal indicating to read data from the controller memory 56. The register store-signal generating part 5805 generates a register store-signal as a timing signal to store in the register 584.

The security part 58 configured as described above can prevent information stored in the storage device 20 from being read by illegal users.

That is, the sequencer 580 provided in the security part 58 starts the sequence counter 5801 to count when power is turned ON. The sequence counter 5801 executes the memory address generating part 5803 to generate a memory address indicating the cipher key in the controller memory 56. Subsequently, the read-signal generating part 5804 is executed to generate a read-signal indicating to read data from the controller memory 56.

In response to the generated memory address and read-signal, the controller memory 56 reads data, for example, 16 bytes of data from the indicated memory address. That is, the cipher key is read when the cipher key is stored or the initial data is read when the cipher key is not stored.

Thereafter, the sequencer 580 generates a register store-signal to be a store-timing signal for the register 584 by executing the register store-signal generating part 5805.

In response to the register store-signal, the register 584 maintains the data read from the controller memory 56.

As mentioned, when the data read from the controller memory 56 is stored in the register 584, the decoder 585 decodes the data so as to determine whether the data is the cipher key or the initial data. Based on the result of the decoder 585, for example, the control flag latching circuit 586 latches "1" into the control flag when the data maintained in the register 584 is the cipher key or "0" into the control flag when the data maintained in the register 584 is the initial data.

Based on the control flag latched by the control flag latching circuit 586, the test selecting part 582 cuts off the test signal output from the test input I/F part 581 to prevent executing the test function when the data maintained by the register 584 is the cipher key. On the other hand, the test selecting part 582 does not cut off the test signals but carries out the test function when the data maintained by the register 584 is the initial data.

In this method, the security part 58 prohibits transferring to a test mode when the cipher key is stored in the controller memory 56 when power is ON. Therefore, it is possible to prevent the reading of the cipher keys by utilizing the test function.

Moreover, the security part 58 controls transfer to the test mode when any cipher key is not stored in the controller memory 56 when power is ON. Therefore, it is possible to test to check whether or not the storage device controller 50 is performs as designed.

That is, when the storage device controller 50 is tested, a maker of the storage device 20 uses the host device 30 to delete the cipher keys stored in the controller memory 56 (reset the controller memory 56) and turns off and on the power. Consequently, the test mode becomes available.

The security part 58 carries out the same method when the controller memory 56 is reset. Since the cipher keys are deleted by the reset, the test signals output from the test input I/F part 581 are not cut off and then the test function is executed.

When a user maker, which stores information into the storage device 20 to sell the information, requires a specific address for the cipher keys, the maker of the storage device 20 designs the memory address generating part 5803 such that the memory address generates the specific address for the cipher keys.

However, when the user maker does not require such a specific address, the storage device maker designs the storage device 20 such that the memory address generating part 5803 generates a memory address to read all data other than the working data from the controller memory 56.

In this case, the register 584 sequentially maintains data read from the controller memory 56. Accordingly, a circuit may be provided to prohibit the register 584 from maintaining data when the control flag latching circuit 586 latches the control flag indicating that the cipher key is read.

As described above, when no cipher key is stored in the cipher key storage area of the controller memory 56, predetermined initial data such as all zero data, which is not used as a cipher key, is stored in the cipher key storage area of the controller memory 56.

Thus, it is possible to determine whether or not the cipher keys are stored. However, the user maker may not use the initial data determined by the maker of the storage device 20.

In this case, the maker designs the storage device 20 such that initial data determined by the user maker is used.

Or, the user maker may not use the initial data determined by the storage device maker and may not require any specific initial data. In this case, the storage device maker may request the user maker to write data indicating at least one address of cipher keys in a special storage area of the working storage area of the controller memory 56 when the user maker stores the cipher keys. The storage device 20 may be configured such that when the data written in a special storage area is read, the decoder 585 decodes the data to determine whether or not the cipher keys are stored.

In the first embodiment in FIG. 4, when the power source is turned on, it is determined whether or not the cipher keys are stored in the controller memory 56. Based on the result, the control flag latching circuit 586 latches the control flag. In addition, when the controller memory 56 is reset, it is determined whether or not the cipher keys are stored in the controller memory 56. Based on the result, the control flag latching circuit 586 latches the control flag. Further, the same process may be carried out at other times.

Figure 6:
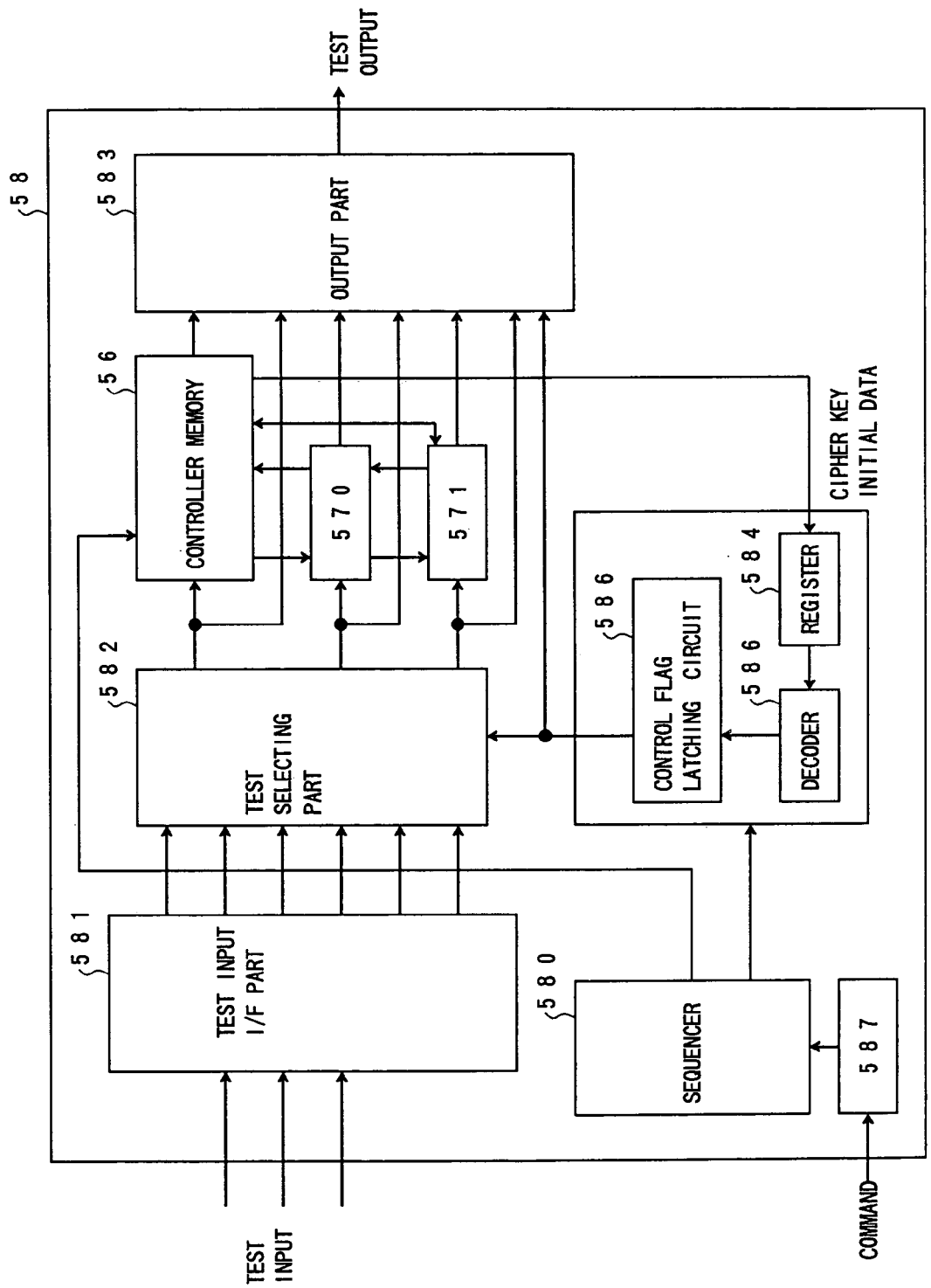
FIG. 6 is a diagram showing a security part according to a second embodiment of the present invention.

FIG. 6 is a diagram showing a security part according to a second embodiment of the present invention. In FIG. 6, parts that are the same as those shown in the previously described figures are given the same reference numbers and the explanation thereof will be omitted.

For example, as shown in FIG. 6, a command interpreting part 587 is provided in the security part 58 to interpret a command. When the command interpreting part 587 detects a command for processing the cipher keys, the command interpreting part 587 determines whether or not the cipher keys are stored in the controller memory 56. Based on the determination result, the control flag latching circuit 586 latches the control flag.

Figure 7:
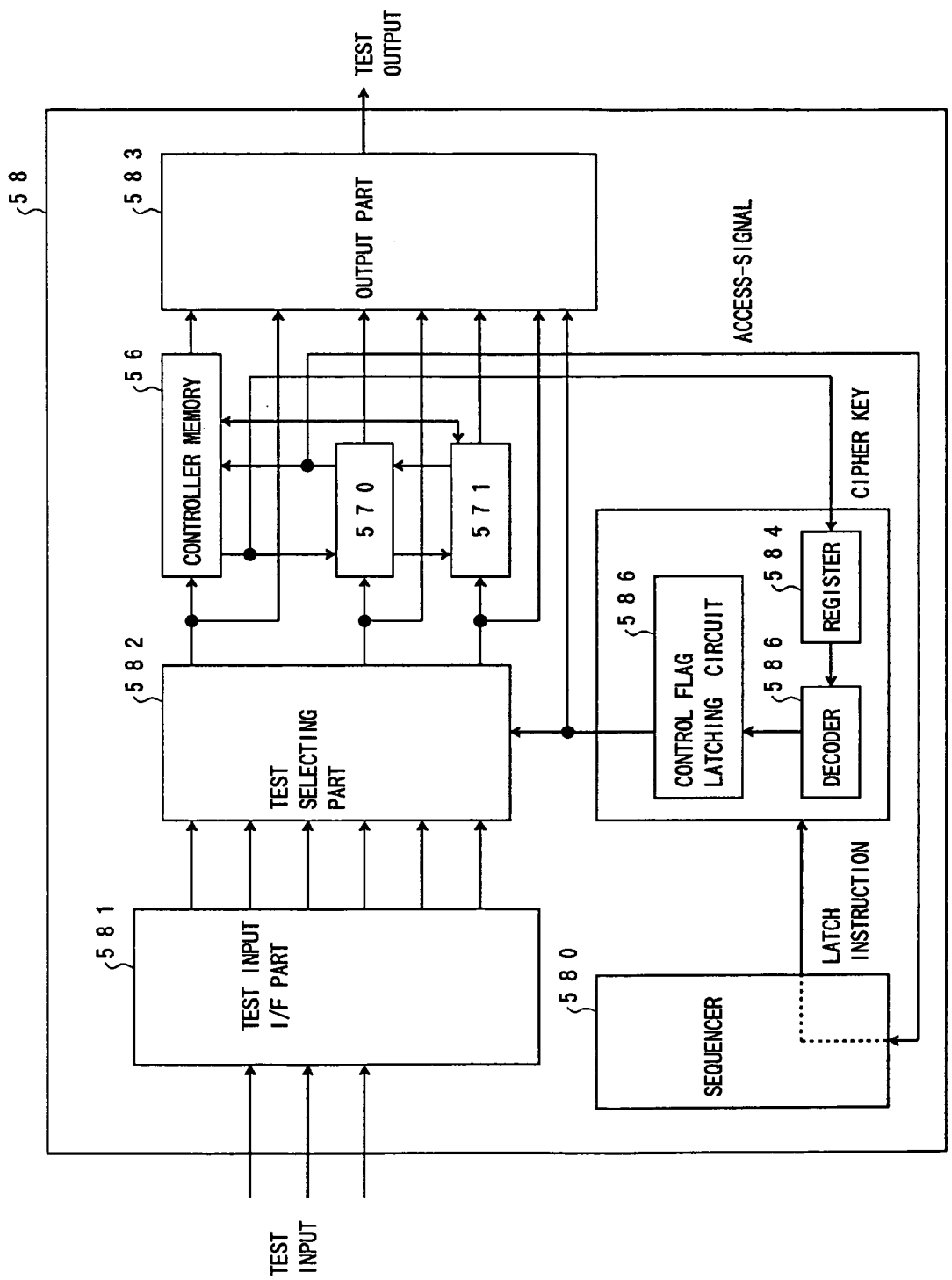
FIG. 7 is a diagram showing a security part according to a third embodiment of the present invention.

FIG. 7 is a diagram showing a security part according to a third embodiment of the present invention. In FIG. 7, parts that are the same as those shown in the previously described figures are given the same reference numbers and the explanation thereof will be omitted.

In the first embodiment described in FIG. 4, in a case in which the cipher keys are stored in the controller memory 56 when the power source is ON, since it is prohibited to transfer in the test mode, it is possible to prevent information stored in the storage device 20 from being read by illegal users. In the third embodiment in FIG. 7, when the encrypting/decrypting circuit 570 reads the cipher keys, the test selecting part 582 cuts off the test signals output from the test input I/F part 581. That is, a current working test process is cancelled in the test mode or transferring from the normal mode to the test mode is prohibited.

Generally, when the encrypting/decrypting circuit 570 reads the cipher keys, it is possible for illegal users to read the cipher keys by utilizing the test function. However, the storage device 20 according to the third embodiment can eliminate this disadvantage.

In the third embodiment, the sequencer 580 includes the register store-signal generating part 5805 only as shown in FIG. 8. When the encrypting/decrypting circuit 570 outputs an access signal for the cipher keys stored in the controller memory 56 by using the register store-signal generating part 5805, the encrypting/decrypting circuit 570 generates a register store-signal to be a store-timing signal of the register 584.

In the configuration according to the third embodiment in FIG. 7, when the encrypting/decrypting circuit 570 sends the access signal for accessing the cipher keys to the controller memory 56, the sequencer 580 generates the register store-signal to be the store-timing signal of the register 584 by executing the register store-signal generating part 5805.

In response to the register store-signal, the register 584 maintains one cipher key randomly read by the encrypting/decrypting circuit 570.

When the cipher key is maintained in the register 584, the decoder 585 decodes the data maintained in the register 584 so as to determine whether or not the data is the cipher key. Subsequently, based on the determination result, the control flag latching circuit 586 latches for example "1", which indicates that the data maintained in the register 584 is the cipher key, into the control flag.

Based on the control flag latched by the control flag latching circuit 586, the test selecting part 582 cuts off the test signals output from the test input I/F part 581 to prohibit from executing the test function.

In this approach, the security part 58 cancels a current working test process in the test mode or prohibits transferring from the normal mode to the test mode. Therefore, it is possible to be certain of preventing information including the cipher keys stored in the storage device 20 from being read illegally by utilizing the test function.

In the third embodiment in FIG. 7, by maintaining the cipher key read from the encrypting/decrypting circuit 570 in the register 584, the control flag latching circuit 586 latches the control flag to cut off the test signals. But alternatively, as shown in FIG. 9, which is a diagram showing a security part according to a fourth embodiment of the present invention, in response to the access signal output from the encrypting/decrypting circuit 570, the sequencer 580 controls the control flag latching circuit 586 to latch the control flag in order to cut off the test signals.

Figure 10A:
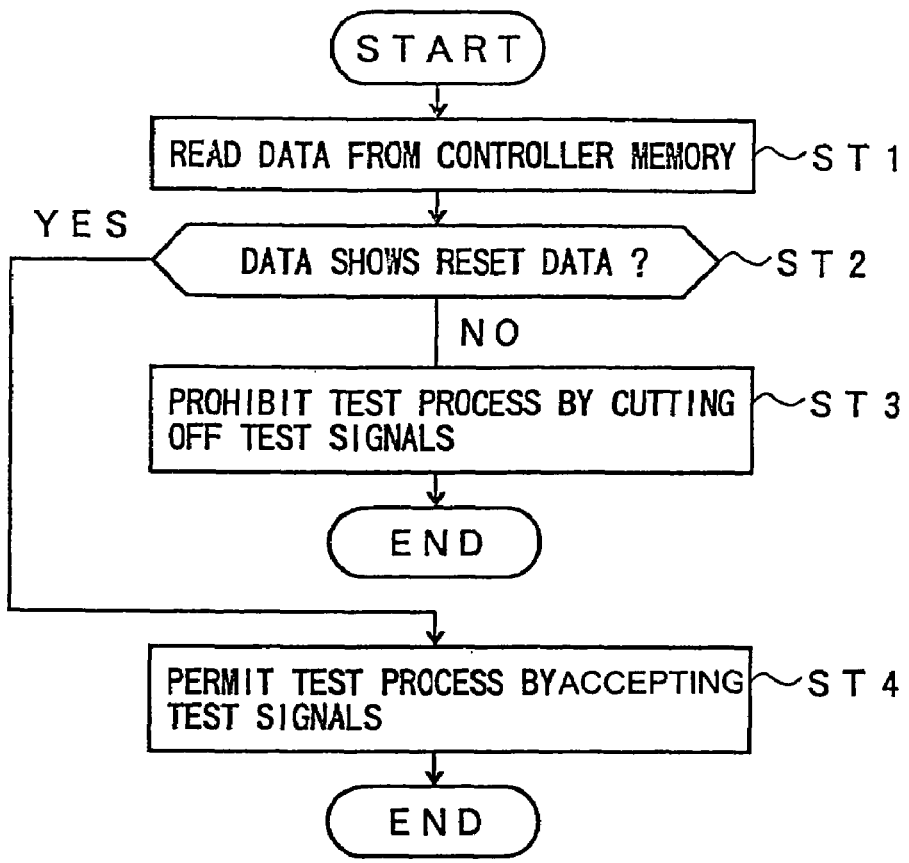
FIG. 10A is a flow chart for explaining a process of the storage device controller in the configuration in FIG. 4 according to the first embodiment of the present invention and FIG. 10B is a flow chart for explaining a process of the storage device controller in the configuration in FIG. 7 according to the first embodiment of the present invention.

FIG. 10A is a flow chart for explaining a process of the storage device controller in the configuration in FIG. 4 according to the first embodiment of the present invention.

In FIG. 10A, when the power source is turned on, the storage device controller 50 reads data from the cipher key storage area of the controller memory 56 (step ST1). When the read data does not indicate the reset data, that is, when the read data is the cipher key, the test signals are cut off and the test process is prohibited (steps ST2 and ST3). On the other hand, when the read data is reset data, it is allowed to input test signals and the test process is executed (step ST4).

In this configuration of the storage device 20, it is prohibited to transfer to the test mode when the cipher keys are stored in the controller memory 56. Therefore, it is possible to be certain to prevent the cipher keys stored in the storage device 20 from being read illegally by utilizing the test function.

Figure 10B:
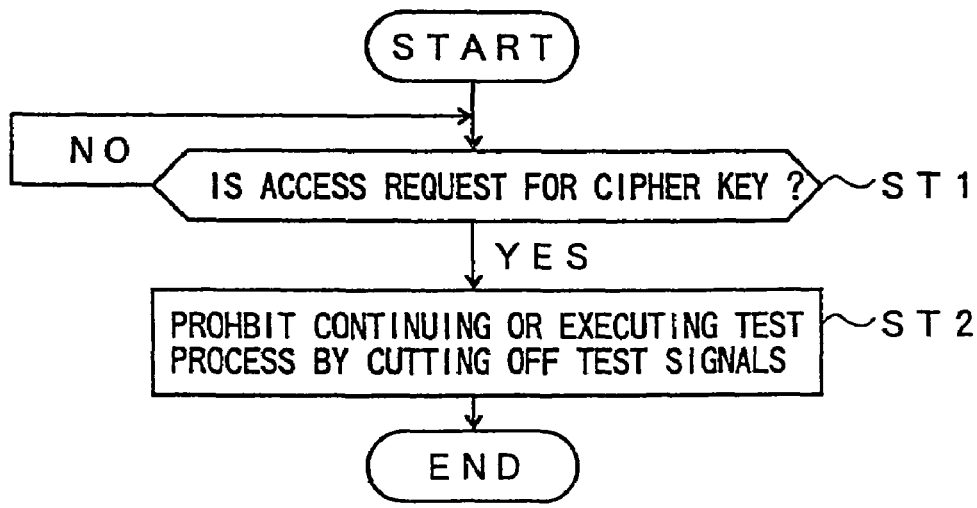

FIG. 10B is a flow chart for explaining a process of the storage device controller in the configuration in FIG. 7 according to the first embodiment of the present invention.

In FIG. 10B, when the encrypting/decrypting circuit 570 outputs the access request to access the cipher keys, the storage device controller 50 cuts off the test signals. Thus, the test process can be prohibited or a working test process can be canceled.

In this configuration of the storage device 20, when the cipher key is read from the controller memory 56, it is possible to prevent transferring to the test mode or to immediately cancel the test mode. Therefore, it is possible to be certain in preventing the cipher keys stored in the storage device 20 from being read illegally by utilizing the test function.

The embodiments described above are not limited to protect the cipher keys only.

The present invention is not limited to the specifically disclosed embodiments, variations and modifications, and other variations and modifications may be made without departing from the scope of the present invention.

The present application is based on Japanese Priority Application No. 11-195527 filed on Jul. 9, 1999, the entire contents of which are hereby incorporated by reference.

What is claimed is:

1. A storage device for maintaining information, which is accessed by a host device through a host interface, when power is OFF and being capable of executing a test process based on test signals, comprising:

a memory including a plurality of memory locations and storing secret data or initial data;

a test terminal inputting the test signals indicating a memory location among the plurality of memory locations;

an instruction part sending a read out instruction for instructing the memory storing secret data to read out data stored at the memory location;

a decoding part decoding data read out by the memory stored at the memory location in response to the data reading instruction and determining whether the data is secret data or initial data;

a maintaining part maintaining information resulting from the decoding part in a volatile state; and a cutting-off part cutting off the test signals input from the test terminal when the maintaining part maintains information indicating that secret data is stored at the memory location.

2. The storage device as claimed in claim 1, wherein said read out instruction sent by said instruction part is a secret data read out instruction for instructing the memory storing secret data to read out the secret data.

3. The storage device as claimed in claim 1, wherein said read out instruction sent by said instruction part is a data read out instruction for instructing the memory storing secret data to read out all data stored in the memory other than working data.

4. The storage device as claimed in claim 1, wherein said read out instruction sent by said instruction part is a data read out instruction for instructing the memory storing secret data to read out data indicating a presence of the secret data stored in an area that is not for the secret data.

5. The storage device as claimed in claim 1, wherein said instruction part sends the read out instruction when the power is ON.

6. The storage device as claimed in claim 1, wherein said instruction part sends the read out instruction when the memory is reset.

7. The storage device as claimed in claim 1, wherein said instruction part sends the read out instruction when a command for operating secret data is made.

8. A storage device for maintaining information, which is accessed by a host device through a host interface, when the power is OFF and being capable of executing a test process based on test signals, comprising:

a memory including a plurality of memory locations and storing secret data or initial data;

a decoding part gathering a set of data read out by the memory storing secret data or initial data at a memory location among the plurality of memory locations in response to an access request indicating the memory location, and decoding the data read out by the memory;

a maintaining part maintaining information resulting from the decoding part in a volatile state; and a cutting-off part cutting off the test signals input from a test terminal when the maintaining part maintains information indicating that secret data is stored at the memory location.

9. A storage device for maintaining information, which is accessed by a host device through a host interface, when power is OFF and being capable of executing a test process based on test signals, comprising:

a memory including a plurality of memory locations and storing secret data or initial data;

a maintaining part maintaining, in a volatile state, information indicating that an access request is conducted to a memory location among the plurality of memory locations storing secret data; and a cutting-off part cutting of the test signals input from a test terminal when the maintaining part maintains information indicating that the access request is conducted to a memory location storing secret data.

10. A storage device for non-volatile storage of information and which executes a test process, the storage device communicating with a host via a host interface, the storage device comprising:

a memory including a plurality of memory locations and storing secret data or initial data;

a test terminal which receives at least one test signal indicating a memory location among the plurality of memory locations from which to read out data;

a maintaining part which maintains information about the data stored at the memory location in a volatile state;

a cutting-off part which cuts off the at least one test signal from the test terminal when the maintaining part maintains information indicating that the data stored at the memory location includes secret data.

* * * * *

UNITED STATES PATENT AND TRADEMARK OFFICE
CERTIFICATE OF CORRECTION

PATENT NO. : 7,076,667 B1 Page 1 of 1
APPLICATION NO. : 09/531105
DATED : July 11, 2006
INVENTOR(S) : Shinkichi Gama et al.

It is certified that error appears in the above-identified patent and that said Letters Patent is hereby corrected as shown below:

Column 11, Line 15, Change "cutting of" to --cutting off--.

Signed and Sealed this

Second Day of January, 2007

JON W. DUDAS
*Director of the United States Patent and Trademark Office*